United States Patent
Bickell et al.

(10) Patent No.: US 11,749,435 B2
(45) Date of Patent: Sep. 5, 2023

(54) PRE-COOLING AND REMOVING ICE BUILD-UP FROM CRYOGENIC COOLING ARRANGEMENTS

(71) Applicant: Siemens Healthcare Limited, Camberley (GB)

(72) Inventors: William James Bickell, Witney (GB); Simon Chorley, Witney (GB); Zhi Qiang Long, Shenzhen (CN); Jun Zhao Wu, Shenzhen (CN)

(73) Assignee: Siemens Healthcare Limited, Camberley (GB)

( * ) Notice: Subject to any disclaimer, the term of this patent is extended or adjusted under 35 U.S.C. 154(b) by 0 days.

(21) Appl. No.: 17/490,309

(22) Filed: Sep. 30, 2021

(65) Prior Publication Data
US 2022/0102041 A1 Mar. 31, 2022

(30) Foreign Application Priority Data
Sep. 30, 2020 (CN) .......................... 202011060915.3

(51) Int. Cl.
*H01F 6/04* (2006.01)
*H01F 6/06* (2006.01)

(52) U.S. Cl.
CPC .................................. *H01F 6/04* (2013.01); *H01F 6/06* (2013.01)

(58) Field of Classification Search
CPC .......... H01F 6/04; H01F 6/06; G01R 33/3804
See application file for complete search history.

(56) References Cited

U.S. PATENT DOCUMENTS

| 2011/0179809 A1 | 7/2011 | Zhang et al. |
| 2013/0008187 A1 | 1/2013 | Kraus et al. |
| 2014/0243205 A1 | 8/2014 | Ackermann et al. |
| 2015/0099639 A1 | 4/2015 | Gore |
| 2016/0078987 A1 | 3/2016 | Simpkins et al. |

FOREIGN PATENT DOCUMENTS

| EP | 2859373 A1 | 4/2015 | |
| GB | 2474949 A * | 5/2011 | ............. F25D 19/00 |
| GB | 2513351 A | 10/2014 | |
| GB | 2566024 A * | 3/2019 | ............. F17C 13/007 |

* cited by examiner

*Primary Examiner* — Mohamad A Musleh
(74) *Attorney, Agent, or Firm* — Banner & Witcoff Ltd.

(57) ABSTRACT

A superconducting magnet arrangement including: an outer vacuum container (OVC) housing magnet coils; a cryogen vessel thermally linked to the magnet coils; a cold head sock accommodating a cold head, with a thermal contact provided between the cold head and the magnet coils; tubes linking the interior of the cryogen vessel with the interior of the cold head sock; and a thermosiphon circuit defined by the cryogen vessel, the tubes, and the cold head sock. Pre-cooling and removal of ice build-up may be performed using the thermosiphon circuit.

8 Claims, 3 Drawing Sheets

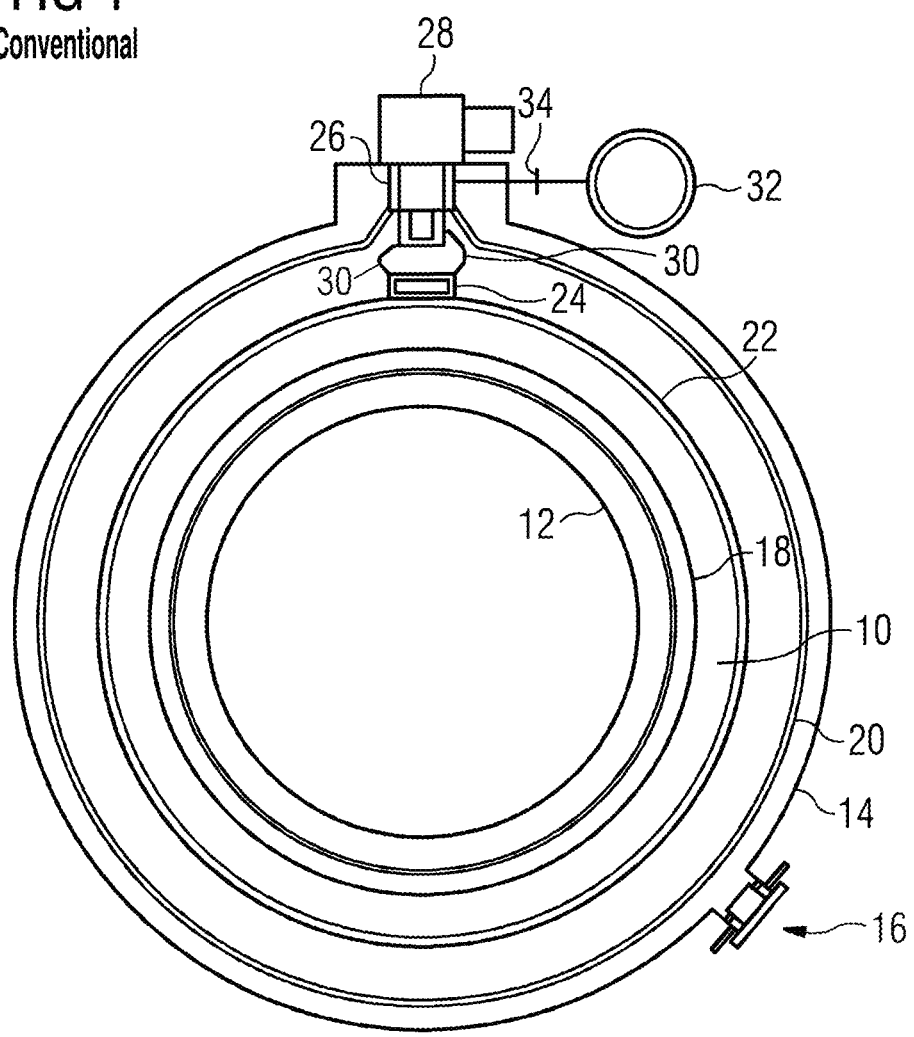
FIG 1
Conventional

PRE-COOLING AND REMOVING ICE BUILD-UP FROM CRYOGENIC COOLING ARRANGEMENTS

TECHNICAL FIELD

The present disclosure relates to cryogenic cooling arrangements. In particular, it relates to cryogenic cooling arrangements for superconducting magnets.

BACKGROUND

Known "low cryogen-mass" superconducting magnets have a cryogen vessel smaller than the cooled magnet coils. The cryogen vessel is in thermal contact with the cooled coils. In certain known systems, a cryogenic cooler is provided, in the form of an electrically-driven refrigerator, and this is linked to the cryogen vessel by tubes forming a thermosiphon arrangement: cryogen in the cryogen vessel absorbs heat from the coils, by boiling. The boiled-off cryogen rises up through one tube towards a heat exchanger cooled by the cryogenic cooler. The boiled-off cryogen is cooled by the cryogenic cooler back to liquid form, and runs back down a tube, either the same tube or a different tube, into the cryogen vessel.

FIG. 1 illustrates a conventional arrangement of a low-cryogen-mass superconducting magnet. Superconducting magnet coils 10 are mounted within an outer vacuum container ("OVC") which comprises an OVC bore tube 12 and an OVC outer shell 14. A pump out port 16 may be provided, for removing gas from the interior of the OVC to create the required vacuum. A thermal shield is located between the superconducting coils 10 and the OVC, comprising a thermal shield bore tube 18 and a thermal shield outer shell 20. A cooling path 22 is provided: a relatively high conductivity path around the magnet coils 10 to a cryogen vessel 24. The cooling path 22 serves to move heat from magnet coils 10 to cryogen vessel 24. A cold head sock 26 is provided on the OVC, for accommodating cold head 28, an electrically-driven cryogenic refrigerator. Tubes 30 connect the cryogen vessel 24 to the cold head sock 26, to define a thermosiphon arrangement conventional in itself. One tube is connected near an upper extremity of the cryogen vessel 24 to the cold head sock 26 for carrying boiled off vapour, while another tube connects near a lower extremity of the cold head sock 26 to the cryogen vessel 24 for a return flow of liquefied, or at least cooled, cryogen from the cold head sock 26. An amount of cryogen is provided in the cryogen vessel 24, which circulates through the thermosiphon defined by cryogen vessel 24, cold head sock 26 and tubes 30. A gas buffer 32, which may contain cryogen gas, is shown linked to the cold head sock 26 by a connecting port 34. This may illustrate a manner of filling the cryogen vessel 24. The cold head sock 26 may be evacuated through the connecting port 34; a gas buffer 32 filled with cryogen gas is connected to the connecting port 34; the cold head 28 condenses the cryogen gas to liquid, which runs down into the cryogen vessel 24. The gas buffer may be removed, refilled and replaced, and the process repeated until a required quantity of liquid cryogen is present in the cryogen vessel.

Most of the described components serve to provide thermal insulation of the magnet coils 10, by evacuation of the OVC through the pump out port 16, and provision of the thermal shield 18, 20. Cooling is provided, as described, by circulation of cryogen. The vacuum within the OVC 12, 14 eliminates heat transfer to the magnet coils 10 by convection or conduction through gas. The thermal shield 18, 20 reduces heat radiation to the magnet coils 10. The cold head 28 provides active cooling.

During fabrication, the whole structure stays at ambient temperature, about 300K. The superconducting magnet coils 10 must be cooled to a cryogenic temperature for operation: typically around 4K if the cryogen is helium. To cool down the superconducting magnet coils to such temperature using only the cold head 28 will take a long time and use a lot of electricity as the cold head 28 is not efficient at cooling from ambient temperature.

SUMMARY

The present disclosure provides methods and arrangements which may be used to provide faster cooling from ambient temperature. Initial cooling from ambient temperature may be referred to herein as "precooling".

Furthermore, in cooling to such cryogenic temperatures for operation of superconducting magnet coils 10, any impurity gas within the cryogen vessel 24, tubes 30 or cold head sock 26 will freeze to ice. Such ice would typically attach to the coldest heat transfer surface. The ice would form a layer reducing the heat transfer efficiency of that heat transfer surface, and/or may restrict or even block circulation of cryogen in the thermosiphon. Conventional arrangements have not provided a simple way of removing such ice, but may require warming and re-cooling of the whole magnet, which is consuming of time and energy. The present disclosure also provides methods and arrangements which may be used to remove such ice.

BRIEF DESCRIPTION OF THE DRAWINGS

FIG. 1 illustrates a conventional arrangement of a low-cryogen-mass superconducting magnet.

DETAILED DESCRIPTION

Figure 2:
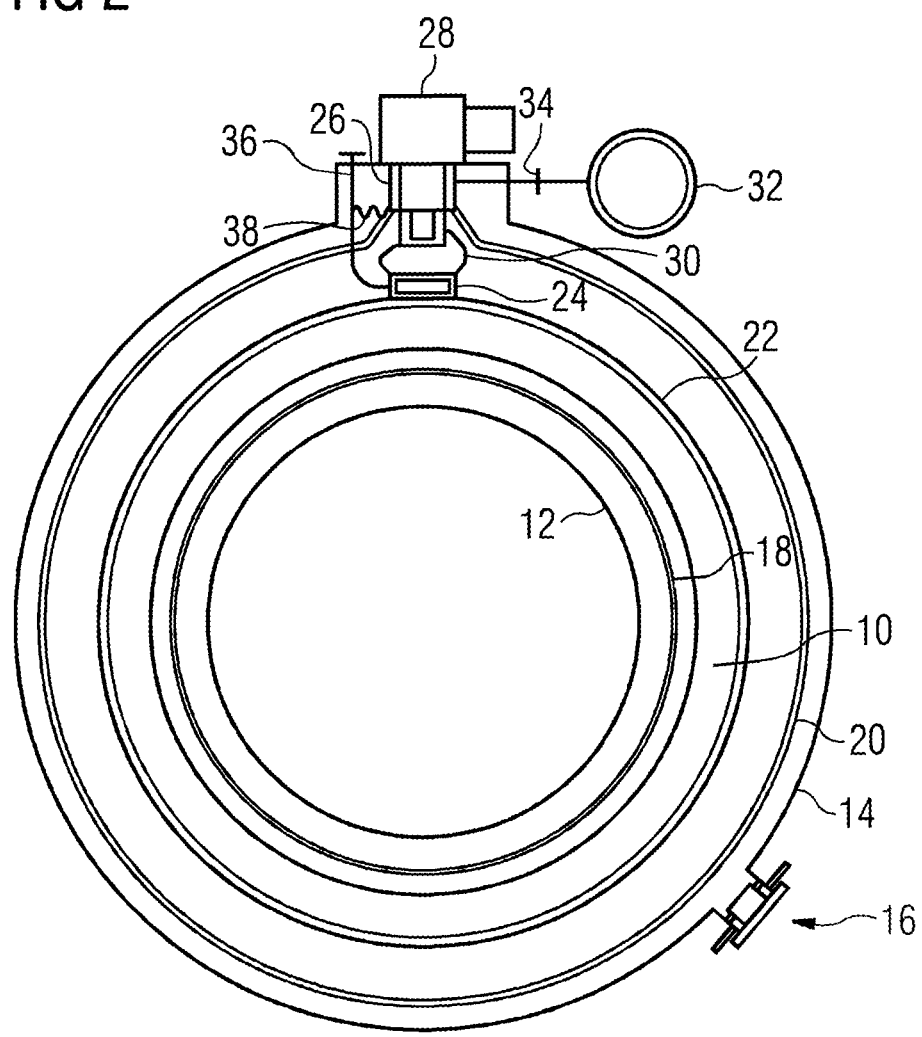
FIG. 2 illustrates a low-cryogen-mass superconducting magnet according to an aspect of the present disclosure in a first mode of operation.

FIG. 2 illustrates a low-cryogen-mass superconducting magnet according to an aspect of the present disclosure. Features in common with FIG. 1 carry corresponding reference labels.

In the illustrated aspect of the disclosure, an auxiliary vent tube 36 is added. A thermal intercept 38 is also added, thermally linking a location on the auxiliary vent tube 36 to a cooling surface. Typically, where the cold head 28 is a two-stage cryogenic cooler, as schematically represented in the drawings, the thermal intercept thermally links a location on the auxiliary vent tube 36 to a part of the cold head sock 26 which is cooled by a first stage of the cold head 28.

The auxiliary vent tube 36 provides a fluid path from the cryogen vessel 24 to exterior of the OVC 12, 14. In normal operation of the superconducting magnet, when the auxiliary vent tube 36 is not in use, the auxiliary vent tube 36 is closed, for example by a relief valve, a burst disc, or a blind flange.

The thermal intercept 38 thermally links a location on the auxiliary vent tube 36 to a location on the cold head sock 26 for cooling by a first stage of the cold head 28. The thermal intercept 38 serves to reduce the heat load through the auxiliary vent tube 36 to the cold mass, and reduces the tendency for thermal acoustic oscillation which would introduce a large heat load to the cold system.

The thermal intercept 38 reduces the thermal conduction heat load through the tube. During normal operation or cool down, natural convection of cryogen gas occurs between cold head 28 and cryogen vessel 24, and the auxiliary vent tube 36 plays no role. A small volume of cryogen gas will remain in the auxiliary vent tube 36, but will play no part in the cooling operation.

Figure 3:
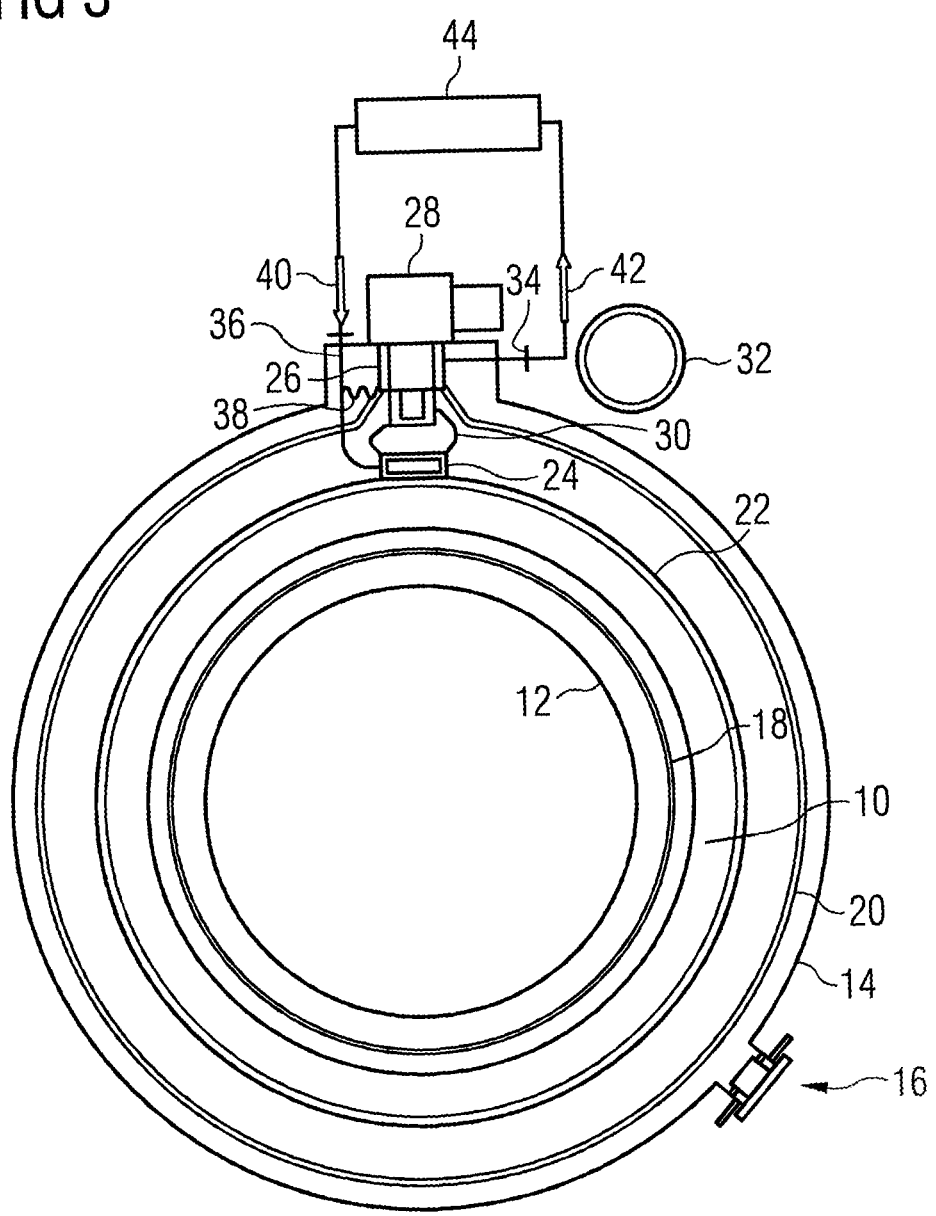
FIG. 3 illustrates a low-cryogen-mass superconducting magnet according to an aspect of the present disclosure in a second mode of operation.

FIG. 3 illustrates the aspect of FIG. 2 when used for precooling the magnet coils 10 from ambient temperature. Features in common with FIG. 1 or FIG. 2 carry corresponding reference labels. The auxiliary vent tube 36 is here used to enable an external cooling arrangement 44 to provide initial cool-down from ambient temperature. Such an external cooling arrangement 44 may give a greater cooling power at ambient temperature than the cold head 28. An arrangement for circulating cooling fluid through the thermosiphon circuit is thereby provided.

The auxiliary vent tube 36 is opened to provide an inlet 40 for a cooling fluid. Gas buffer 32 is disconnected from connecting port 34 to provide an outlet 42 for the cooling fluid.

For example, a cheap cryogen liquid such as nitrogen, or a cold gas which may again be nitrogen, may be introduced into the inlet 40 though the auxiliary vent tube 36, pass through the cryogen vessel 24, which does not contain any other cryogen at this stage, and out through the connecting port 34 to the outlet 42. Liquid or gaseous nitrogen is a preferred material for such use, as it is abundant, cheap, may simply be allowed to vent to atmosphere and requires relatively few safety precautions in its employment.

In the simplest arrangement, liquid nitrogen may be introduced into the auxiliary vent tube 36, be allowed to boil in the cryogen vessel 24 and the boiled off nitrogen gas may then be allowed to vent to atmosphere as gas out of the connecting port 34, or outlet 42. Alternatively, although not illustrated in the drawings, the nitrogen may flow in the opposite direction, being introduced as a liquid into the connecting port 34 and allowed to vent as a gas out through the auxiliary vent tube 36.

Cold nitrogen gas may be employed in a similar manner. Alternatively, a cooling loop may be provided, with nitrogen, or other heat transfer material, circulating through the inlet 40, auxiliary vent tube 36, cryogen vessel 24, connecting port 34, and outlet 42 to a refrigerator, and back through inlet 40. A refrigerator in such a cooling loop may be of a design having a much greater cooling power at 300K than the cold head 28. Once the magnet coils 10 have been cooled somewhat by the external cooling arrangement 44, the cold head 28 may be brought into operation to complete cooling of the magnet coils 10 to the required cryogenic operational temperature. Using liquid nitrogen, the magnet coils 10 may be cooled to a temperature in the region of 80-100K. Some helium of this temperature or above may be used to flush out any nitrogen remaining in the cryogen vessel 24 or cooling loop 30, 26, without risk of the nitrogen freezing to ice. The auxiliary vent tube 36 is then closed, for example by use of by a relief valve, a burst disc, or a blind flange as mentioned above. The cryogen vessel 24 and cooling loop 30, 28 may then be filled with helium, or other preferred cryogen for operation of the superconducting magnet coil 10, from gas buffer 32. Cooling may proceed by cooling of that cryogen by the cold head 28 and circulation of that cryogen around the thermosiphon defined by cryogen vessel 24, tubes 30 and cold head sock 26. As cooling progresses, the cryogen may liquefy and more cryogen may be introduced through connecting port 34 from gas buffer 32 to fill the cryogen vessel 24.

By this method, the cool down time can be considerably shortened compared with a conventional method of cooling magnet coils 10 from ambient temperature to their cryogenic operating temperature using cold head 28 only.

According to a further aspect of the present disclosure, the auxiliary vent tube 36 may be used in a method to clear ice from within the thermosiphon circuit of cryogen vessel 24, tubes 30 and cold head sock 26. In some cases, the cryogen in the thermosiphon is not pure, for example due to air ingress during production or maintenance, leakage, impure cryogen as supplied, etc. When the superconducting magnet is cooled down, such impurity gases will freeze on cold surfaces in the cryogen vessel 24, tubes 30 or cold head sock 26.

A configuration corresponding to that shown in FIG. 3 may be used for de-icing. A warm gas, that is to say, a gas at a temperature above the evaporation point of the material making up the ice, is circulated in a manner similar to that shown in FIG. 3: into the inlet 40, through the auxiliary vent tube 36 and into the cryogen vessel 24. The configuration accordingly comprises an arrangement for circulating a fluid at a temperature in excess of an evaporation point of the material of the ice. The warm gas also flows through cold head sock 26 and tubes 30 to leave the thermosiphon circuit through connecting port 34 to outlet 42. Feature 44, representing an external cooling arrangement in FIG. 3 where the arrangement is used to precool the magnet coils 10, may be replaced by a heater to maintain the warm gas at a desired temperature, sufficient to cause evaporation of the material of the ice in the thermosiphon circuit. The warm gas may accordingly circulate around the thermosiphon circuit comprising inlet 40, auxiliary vent tube 36, cryogen vessel 24, cold head sock 26, tubes 30, connecting port 34, outlet 42 and a heater. In a variant of such an aspect, the arrangement may be adjusted such that the warm gas circulates in the opposite direction. In another variant, the warm gas does not circulate around a closed circuit, but is introduced into inlet 40 and is vented to atmosphere through outlet 42; or alternatively may be introduced into outlet 42 and vented to atmosphere through inlet 40. In such arrangements, the use of nitrogen may be preferred as the warm gas, due to its properties of abundance, low cost and not being regarded as a pollutant.

Passage of the warm gas through the thermosiphon circuit vaporizes any ice in the cryogen vessel 24, tubes 30 or cold head sock 26. The unidirectional flow of the de-icing warm gas as proposed above effectively cleans the whole thermosiphon cryogen circuit. This de-icing method locally warms up the cryogen vessel 24, tubes 30 and cold head sock 26 to a temperature in excess of the evaporation point of the material of the ice, and purges the material of the ice from the thermosiphon cryogen circuit. The OVC 12, 14, magnet coils 10 and associated hardware have a much greater thermal inertia, and such evaporation and purging of ice material may be performed without warming the magnet coils 10 to any significant degree. Preferably, once an ice purge operation is complete, cooling of the magnet coils 10 may resume using the cold head 28. Briefly, the components of the thermosiphon cryogen circuit, cryogen vessel 24, tubes 30 and cold head sock 26 may in fact be cooled by transferring heat to the magnet coils 10 through the cooling path 22. However, the thermal inertia of the magnet coils 10 will be so great that no significant change in their temperature should be observed. In this way, an ice purge may be carried out without raising the temperature of the superconducting coils to any significant degree. The cold mass, comprising magnet coils 10 and associated hardware, can be kept cold with minimum heat input. Operation of the cold head 28 can ensure that the magnet coils remain at about operational temperature. The superconducting magnet may therefore be brought back into service rapidly after an intervention to remove ice.

The present disclosure accordingly provides a method and apparatus for precooling of magnet coils; and for purging of ice material from a thermosiphon cryogen circuit.

In a preferred aspect, particularly for use of the auxiliary vent tube 36 for cooling the magnet with an external cooling source, the upper, "warm" end of the auxiliary vent tube 36, accessible from outside the OVC, is arranged to be capable of connecting to a standard joint for cryogenic transfer line. For example, the upper part of the auxiliary vent tube 36 may be straight with a suitable inner diameter for inserting a cryogenic thermally insulated pipe line, which may thereby be used to transfer the cooling cryogen into the auxiliary vent tube 36 with small heat load.

Ice materials can be purged, while the magnet cold mass can be kept cold with very small heat input, and the magnet can be re-cooled by the cold head 28 in a short time.

The lower, "cold" end of the auxiliary vent tube 36 connects to the cryogen vessel 24. When the auxiliary vent tube 36 is used to precool the magnet coils 10 using an external cooling source 44, the cooling cryogen can cool cryogen vessel 24. In the case of de-icing, the warm gas locally warms up the cryogen vessel 24 to vaporize any ice.

The wall thickness and material of the auxiliary vent tube 36 should be optimized by balancing contradictory requirements of low thermal conductivity against high pressure capability. A suitable material may be stainless steel, but the other materials that can meet the performance requirements may alternatively be used.

The auxiliary vent tube 36 can be made from a bent tube or a flexible hose such as braided stainless steel bellows or a combination of straight tube and flexible hose.

The auxiliary vent tube 36 may also provide a safety path for the cryogen circuit. A burst disc or relief valve or similar may be fitted on the upper, warm end of the auxiliary vent tube to seal the auxiliary vent tube when not in use, but also to provide a safety path for egress of cryogen from the thermosiphon cryogen path, for example in case of ice build-up.

Furthermore, the auxiliary vent tube 36 of the present disclosure may be used as a back-up cryogen handling path in case of blockage of the primary cryogen handling path, which is to the connecting port 34. All cryogen related actions, such as filling, evacuation, leak check, cryogen circuit flushing, cryogen charging or release, can be conducted through the auxiliary vent tube 36 in case of blockage of the connecting port 34.

The auxiliary vent tube 36 as provided by the present disclosure may also be used for inspection, for example when used in conjunction with a sight-glass, or when used in conjunction with a borescope which can be passed down through the auxiliary vent tube 36 to investigate the level of ice contamination before/after a de-ice.

The invention claimed is:

1. A superconducting magnet arrangement comprising:
an outer vacuum container (OVC) housing;
magnet coils;
a cryogen vessel thermally linked to the magnet coils;
a cold head sock accommodating a cold head, and a thermal contact provided between the cold head and the magnet coils;
tubes linking the cryogen vessel with the cold head sock such that a thermosiphon circuit is defined by the cryogen vessel, the tubes, and the cold head sock;
a connecting port coupled to the cold head sock and providing a fluid path from the cryogen vessel to an exterior of the OVC housing;
an auxiliary vent tube providing a fluid path from the cryogen vessel to an external cooling arrangement; and
a thermal intercept thermally linking a location on the auxiliary vent tube to a location on the cold head sock.

2. The arrangement of claim 1, wherein the auxiliary vent tube is sealed when not in use.

3. The arrangement of claim 2, wherein a burst disc or relief valve is fitted on an upper, warm end of the auxiliary vent tube to seal the auxiliary vent tube when not in use.

4. An arrangement according to claim 1,
wherein the connecting port is sealed when not in use.

5. An arrangement for pre-cooling a superconducting magnet comprising:
the arrangement according to claim 4; and
an arrangement for circulating a cooling fluid through the cryogen vessel.

6. An arrangement for de-icing a thermosiphon circuit of an arrangement according to claim 4, comprising:
the external cooling arrangement operable to circulate fluid through the cryogen vessel, at a temperature in excess of an evaporation point of a material forming ice within the thermosiphon circuit.

7. A method for pre-cooling a superconducting magnet comprising an arrangement according to claim 4, the method comprising circulating cooling fluid through the cryogen vessel.

8. A method for de-icing a thermosiphon circuit of a superconducting magnet arrangement according to claim 4, the method comprising circulating fluid through the cryogen vessel, at a temperature in excess of an evaporation point of a material forming ice within the thermosiphon circuit.

* * * * *